United States Patent [19]
Sechi

[11] Patent Number: 5,838,201
[45] Date of Patent: Nov. 17, 1998

[54] SOLID STATE POWER AMPLIFIER WITH PLANAR STRUCTURE

[75] Inventor: Franco Nicola Sechi, Palo Alto, Calif.

[73] Assignee: Microwave Power Inc., Santa Clara, Calif.

[21] Appl. No.: 434,582

[22] Filed: May 1, 1995

[51] Int. Cl.$^6$ .............................. H03F 3/60; H03F 3/68
[52] U.S. Cl. ........................................... 330/286; 330/295
[58] Field of Search .................................. 330/53, 56, 57, 330/286, 295

[56] References Cited

U.S. PATENT DOCUMENTS 5,218,322   6/1993   Allison et al. ........................... 330/286

OTHER PUBLICATIONS

Jitendra Goel (copy attached) A K–Band GaAs FET Amplifier with 8.2–W Output Power.
R.P. Flam & J.P. MacGahan (copy attached) Radial Power Combiners for Solid–State Power Amplifiers.
Franco N. Sechi et al. (copy attached) Radially Combined 30 W, 14–16 GHz Amplifier.

*Primary Examiner*—Steven Mottola

[57] ABSTRACT

A solid state power amplifier which combines the output of several power modules by means of a waveguide radial combiner. The physical structure of the amplifier is such that the power modules lay flat on a planar heat sink which can be easily cooled by forced air. The input power can be distributed to the power modules by means of a microstrip divider. The divider can be connected to the modules by means of coaxial cables and the modules can be connected to the radial combiner by means of microstrip to waveguide transitions.

4 Claims, 4 Drawing Sheets

SOLID STATE POWER AMPLIFIER WITH PLANAR STRUCTURE

BRIEF DESCRIPTION OF THE INVENTION

The present invention is directed to a Solid State Power Amplifier (SSPA) where several Power Modules are combined by means of a waveguide radial combiner to achieve the desired power output. In the present invention the power modules are laid down flat on a heat sinking plate, with much improved accessibility and heat dissipation than in previously proposed structures.

BACKGROUND OF THE INVENTION

In the microwave industry there is a strong interest in replacing Traveling Wave Tubes (TWTs) with SSPAs at increasingly high power levels, presently of the order of several hundred Watts. In order to achieve these high power levels, the outputs of several lower power SSPAs, called Power Modules, are typically combined in phase. It is highly desirable that this power combination be achieved with the highest possible efficiency. One of the best ways to achieve efficient combination in phase is provided by the use of a radial waveguide combiner.

A radial combiner is a cylindrical cavity defined by two metallic disks 12 facing each other and by the outputs 14 of a variable number of waveguides departing radially from the disks periphery, as shown in FIG. 1. The microwave power conveyed by the waveguides is collected in the cavity of the combiner and transferred to a central output port. Tuning devices such as ridges, posts, grooves and similar features created in the metallic discs, are generally used to improve the matching and/or the combining efficiency of radial waveguide combiners.

One of the main advantages of this type of combiner is the ability to accommodate with similarly high efficiency a variable number of power modules. There is no limit, in principle, to the number of modules which can be combined. The main practical limitations are the increasingly large size of the combiner and, even more important, the ability to dissipate effectively the heat produced.

In the prior art, two similar radial structures are used at the input and output of the SSPA. The first acts as a divider to distribute the input power equally between all power modules, and the second as a combiner. The SSPA acquires a cylindrical structure as shown in FIG. 2 with the radial divider and combiner as the two bases while the power modules define the lateral surface. This structure does not allow for easy heat sinking, and generally requires more complex devices to remove the generated heat, e.g. heat pipes or a circulating liquid.

Another important advantage of power combination by use of radial combiners is the fact that its efficiency is not drastically reduced if one or more of the input waveguides fails to convey power. This may happen either because one of the power modules fails, or because it is turned off, e.g. for regular maintenance. This characteristic of SSPAs based on radial combiners is often referred to as "graceful degradation", meaning that the power output is only moderately decreased if one module fails, and replacement of the module could be performed, at least in principle, in the field, without turning off the system. This feature is very desirable when the SSPA is used in telecommunications. However in the prior art the structures proposed for SSPAs using radial combiners provide only limited accessibility to the individual modules, thereby limiting the ability to perform replacements in the field.

OBJECTS AND SUMMARY OF THE INVENTION

It is an object of the present invention to provide a planar structure for a radially combined SSPA, such that the power modules are accessible from the top and are secured to a flat heat sink underneath.

It is another object of the present invention to achieve a planar structure by using a radial waveguide combiner at the output of the power modules, while distributing power at the input of said modules by means of a microstrip divider. The higher losses connected with the use of a microstrip component with respect to a similar waveguide component are easily and inexpensively offset with increased gain in the preamplifier. On the contrary, any loss introduced at the output would be very expensive to offset.

It is another object of the present invention to provide suitable transitions capable of efficient power transfer between microstrips and waveguides and viceversa, as required in the proposed SSPA structure.

The foregoing and other objects of the invention are achieved by distributing the input power to the SSPA through a microstrip divider and rigid or semi-rigid cables to the single power modules and recombining the modules output power via microstrip to waveguide transitions and a radial waveguide combiner. The microstrip divider can be easily located on top of the waveguide combiner so that the power modules, radially located around the waveguide combiner, can be fastened with their bottoms to a flat heat sink and remain exposed and accessible from the top, with only thin cables running over them.

DETAILED DESCRIPTION OF A PREFERRED EMBODIMENT

Figure 1:
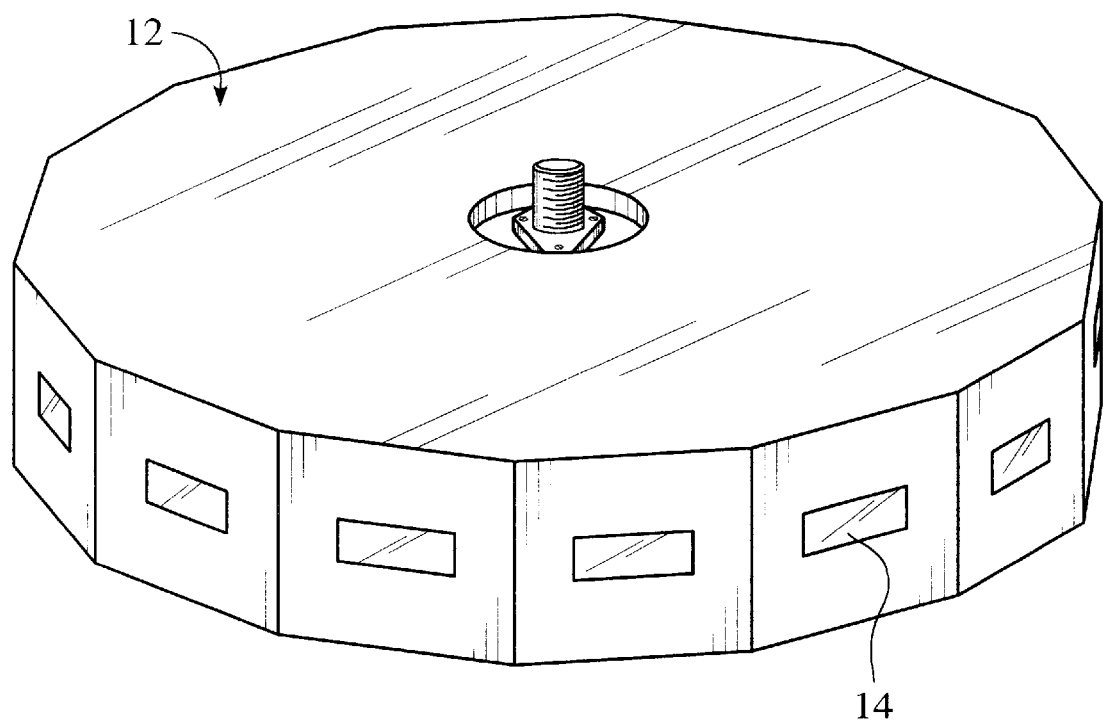
FIG. 1 shows a sketch of a typical radial waveguide combiner.
Figure 2:
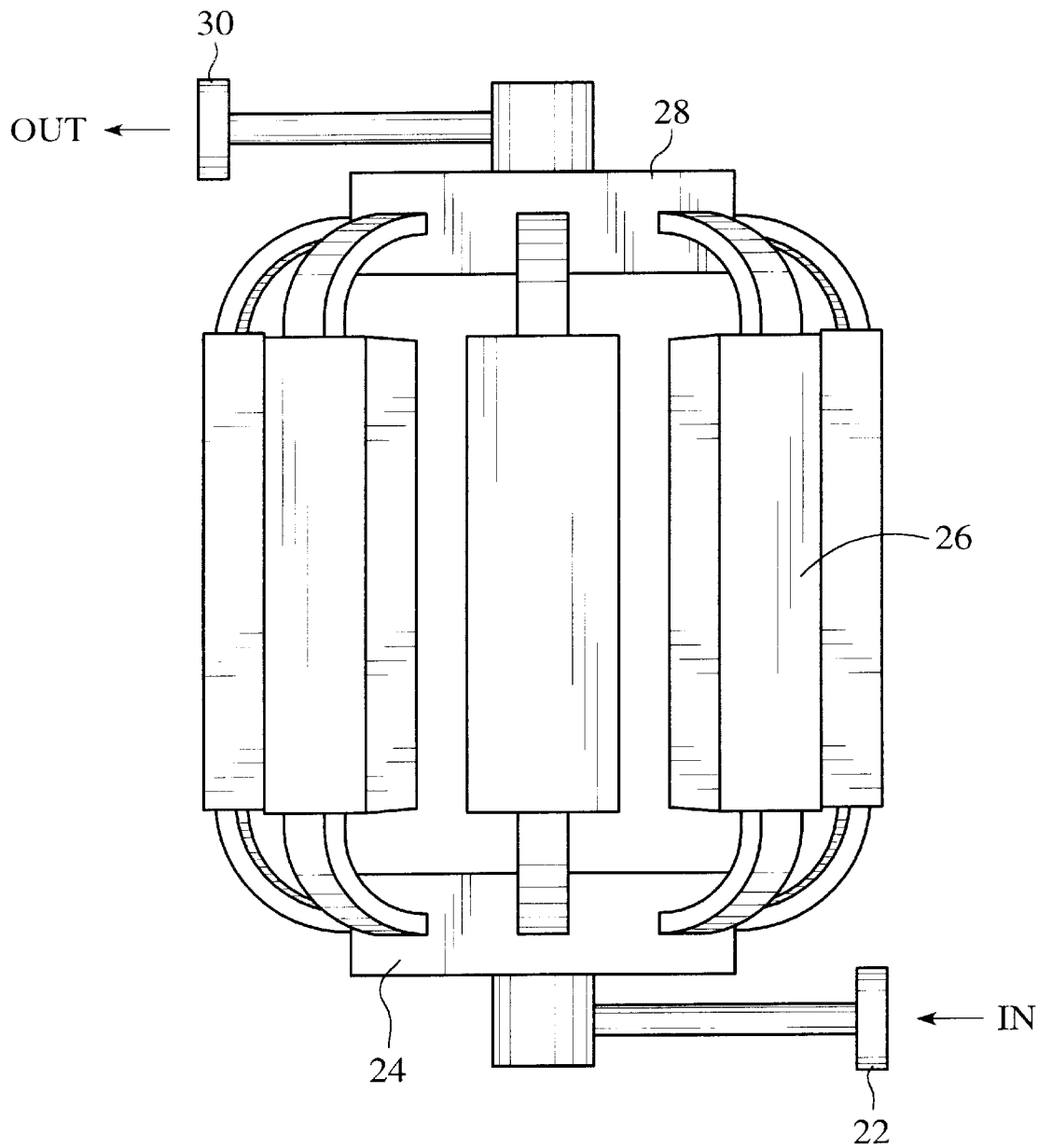
FIG. 2 shows a prior art SSPA with radial waveguide combiners at both input and output.
Figure 3:
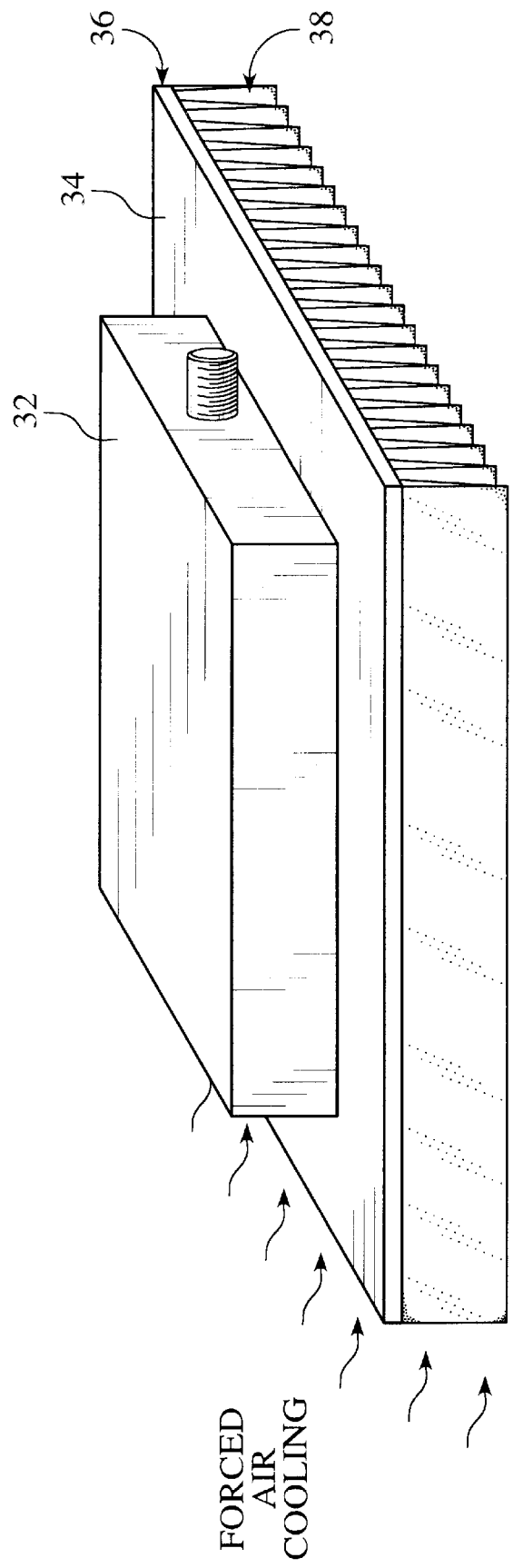
FIG. 3 shows a common method of heat sinking power modules.
Figure 4:
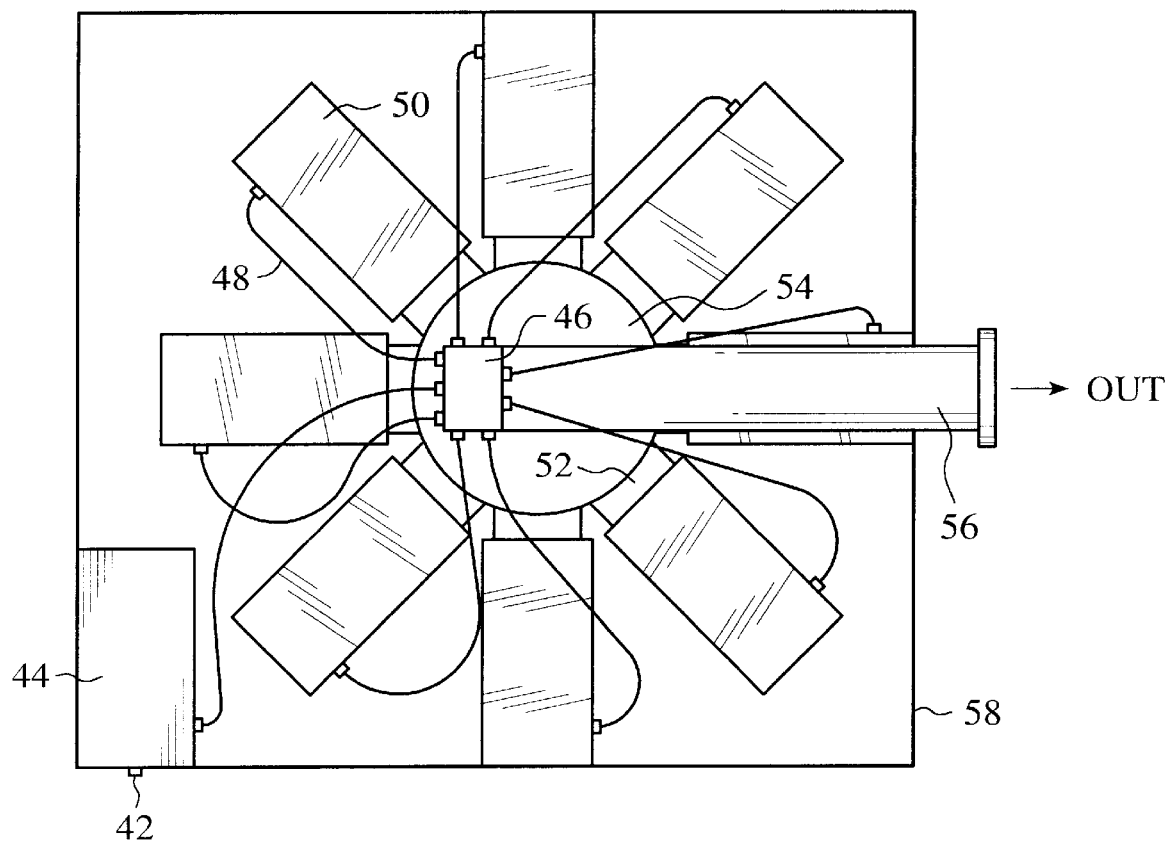
FIG. 4 shows a radially combined SSPA with planar structure in accordance with the present invention.

A typical prior art SSPA with radial waveguide combiners is shown in FIG. 2. The input power enters the SSPA through the input connector 22, is divided into N equal portions by the input radial waveguide combiner 24 and each portion is fed into one of the N power modules 26. The output power from the modules is recombined by the output radial waveguide combiner 28 and is fed to the output port 30. The power modules 26 contain active devices which dissipate considerable amounts of heat, but must be maintained as close as possible to room temperature in order to prevent degradation in both gain and reliability. The SSPA structure depicted in FIG. 2 does not lend itself easily to the most usual and economical method of heat sinking, which is depicted in FIG. 3 for the case of a single power module: the power module 32 is fastened to a heat sink 34, comprising a heavy metal plate 36 and a set of fins 38 solidly connected to the plate. Air is generally blown on the heat sink in the direction of the fins, so as to maximize the transfer of heat from the heat sink to the environment. The SSPA configuration shown in FIG. 2 does not lend itself easily to the application of the simple heat sinking scheme depicted in FIG. 3. Another disadvantage of the configuration shown in FIG. 2 is that some or all of the power modules are generally difficult to access. Accessibility of the power modules is especially desirable when servicing or replacing one of the modules without turning off the whole system. In the preferred embodiment of the present invention, as shown in FIG. 4, the input power enters the SSPA laterally, through the input port 42, is pre-amplified by the preamplifier 44, then divided in N equal portions by the microstrip divider 46. Each portion is fed through a cable 48 to the input of one of the power modules 50. All the signals amplified by the power modules are fed by microstrip to waveguide transitions 52 to the radial waveguide combiner 54. The combined power is collected at the output port 56.

This structure achieves optimal heat sinking of all the power modules, both because the power modules are spread out as much as possible and because they are fastened directly to a flat heat sink of large surface 58, which can be easily cooled through forced air as sketched in FIG. 3. Also, all modules are easily accessible from the top for maintenance, replacement or inspection.

I claim:

1. A microwave SSPA combining the power output of several power modules, each housed in an independent metal housing with at least one dimension larger than the largest wavelength of operation, by means of a waveguide radial combiner at the output and a divider with coaxial output connections to the modules at the input, said SSPA having a planar structure whereby the power modules lay on a flat metal plate, and said power modules being field replaceable using simple mechanical tools.

2. An microwave SSPA as in claim 1 where the planar structure is achieved by using a microstrip divider at the input.

3. A microwave SSPA as in claim 1 where the planar structure is achieved by feeding the input signals to the power modules with a cable connection.

4. A microwave SSPA as in claim 1 where all the microwave circuits are microstrip circuits all the way from the input of the SSPA to the output of the power modules and microstrip to waveguide transitions are used to feed the output radial combiner.

* * * * *